United States Patent
Siemieniec et al.

(10) Patent No.: US 11,133,378 B2
(45) Date of Patent: Sep. 28, 2021

(54) SEMICONDUCTOR DEVICE INCLUDING TRENCH CONTACT STRUCTURE AND MANUFACTURING METHOD

(71) Applicant: Infineon Technologies AG, Neubiberg (DE)

(72) Inventors: Ralf Siemieniec, Villach (AT); Wolfgang Bergner, Klagenfurt (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/929,450

(22) Filed: Jul. 15, 2020

(65) Prior Publication Data

US 2021/0020740 A1    Jan. 21, 2021

(30) Foreign Application Priority Data

Jul. 15, 2019  (DE) .......................... 102019119121.1

(51) Int. Cl.
*H01L 29/66* (2006.01)
*H01L 29/78* (2006.01)
(Continued)

(52) U.S. Cl.
CPC .......... *H01L 29/063* (2013.01); *H01L 21/046* (2013.01); *H01L 21/049* (2013.01);
(Continued)

(58) Field of Classification Search
CPC ... H01L 21/046; H01L 21/049; H01L 29/063; H01L 29/1095; H01L 29/16; H01L 29/1608; H01L 29/66; H01L 29/66068; H01L 29/78; H01L 29/7806; H01L 29/41; H01L 29/41766; H01L 29/872; H01L 29/78705; H01L 29/86; H01L 29/8611;
(Continued)

(56) References Cited

U.S. PATENT DOCUMENTS 8,274,113 B1 * 9/2012 Hsieh ................ H01L 29/42372
                                                257/334
2010/0155836 A1    6/2010 Hebert et al.
(Continued)

FOREIGN PATENT DOCUMENTS

DE    102013214196 A1    1/2014
DE    102014117780 A1    6/2016
(Continued)

*Primary Examiner* — Fazli Erdem
(74) *Attorney, Agent, or Firm* — Murphy, Bilak & Homiller, PLLC

(57) ABSTRACT

A semiconductor device is proposed. A trench gate structure extends from a first surface into a silicon carbide semiconductor body along a vertical direction. A trench contact structure extends from the first surface into the silicon carbide semiconductor body along the vertical direction. A source region of a first conductivity type and a body region of a second conductivity type adjoin a first sidewall of the trench gate structure. A diode region of the second conductivity type adjoins a second sidewall of the trench gate structure opposite to the first sidewall. A shielding region of the second conductivity type adjoins a bottom of the trench contact structure, the shielding region being arranged at a lateral distance to the trench gate structure.

17 Claims, 8 Drawing Sheets

(51) Int. Cl.
*H01L 29/16* (2006.01)
*H01L 29/06* (2006.01)
*H01L 21/04* (2006.01)
*H01L 29/10* (2006.01)

(52) U.S. Cl.
CPC ...... *H01L 29/1095* (2013.01); *H01L 29/1608* (2013.01); *H01L 29/66068* (2013.01); *H01L 29/7806* (2013.01); *H01L 29/7813* (2013.01)

(58) Field of Classification Search
CPC ............. H01L 29/7813; H01L 29/0623; H01L 29/0688
USPC .......................................................... 257/77
See application file for complete search history.

(56) References Cited

U.S. PATENT DOCUMENTS

| | | | |
|---|---|---|---|
| 2012/0292694 A1* | 11/2012 | Hsieh | H01L 29/407 257/331 |
| 2014/0346594 A1 | 11/2014 | Hebert | |
| 2017/0025516 A1 | 1/2017 | Saito et al. | |
| 2019/0172910 A1* | 6/2019 | Siemieniec | H01L 29/0623 |
| 2019/0273157 A1* | 9/2019 | Yilmaz | H01L 29/1095 |

FOREIGN PATENT DOCUMENTS

| | | |
|---|---|---|
| DE | 102018104581 A1 | 9/2018 |
| JP | H07161983 A | 6/1995 |
| JP | 2011035410 A | 2/2011 |
| JP | 2016032105 A | 3/2016 |
| KR | 20140138416 A | 12/2014 |
| KR | 20160138294 A | 12/2016 |

\* cited by examiner

SEMICONDUCTOR DEVICE INCLUDING TRENCH CONTACT STRUCTURE AND MANUFACTURING METHOD

TECHNICAL FIELD

The present disclosure relates to semiconductor devices, in particular, to semiconductor devices including a trench contact structure in a silicon carbide semiconductor body.

BACKGROUND

Semiconductor devices based on silicon carbide (SiC) benefit from the high band gap and breakdown strength of silicon carbide. However, at interfaces between a SiC semiconductor body and a dielectric layer, for example the gate dielectric of a transistor cell of an SiC-MOSFET (SiC metal oxide semiconductor field effect transistor), a high number of interface states are formed, which can be occupied with more or less charge carriers depending on the operating state of the SiC-MOSFET. Charge carriers occupying the interface states influence the mobility and concentration of free charge carriers, which form the field-controlled transistor channel when the transistor cells are switched on. In addition, the high breakdown strength of SiC is usually not fully exploited, since the electric field strength occurring in the gate dielectric and the reliability of the gate dielectric often limit the dielectric strength of the SiC-MOSFET.

The present application aims at a compact SiC semiconductor device that can exploit the intrinsic electric breakdown field strength of silicon carbide to a high degree.

SUMMARY

An example of the present disclosure relates to a semiconductor device. The semiconductor device includes a trench gate structure extending from a first surface into a silicon carbide semiconductor body along a vertical direction. The semiconductor device further includes a trench contact structure extending from the first surface into the silicon carbide semiconductor body along the vertical direction. The semiconductor device further includes a source region of a first conductivity type and a body region of a second conductivity type adjoining a first sidewall of the trench gate structure. The semiconductor device further includes a diode region of the second conductivity type adjoining a second sidewall of the trench gate structure opposite to the first sidewall. The semiconductor device further includes a shielding region of the second conductivity type adjoining a bottom of the trench contact structure. The shielding region is arranged at a lateral distance to the trench gate structure.

Another example of the present disclosure relates to a method of manufacturing a semiconductor device. The method includes forming a trench gate structure extending from a first surface into a silicon carbide semiconductor body along a vertical direction. The method further includes forming a trench contact structure extending from the first surface into the silicon carbide semiconductor body. The method further includes forming a source region of a first conductivity type and a body region of a second conductivity type, both adjoining a first sidewall of the trench gate structure. The method further includes forming a diode region of the second conductivity type adjoining a second sidewall of the trench gate structure opposite to the body region. The method further includes forming a shielding region of the second conductivity type adjoining a bottom of the trench contact structure, wherein the shielding region is arranged at a lateral distance to the trench gate structure.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of SiC semiconductor devices and methods of manufacturing a silicon carbide device and together with the description serve to explain principles of the examples. Further examples are described in the following detailed description and the claims.

DETAILED DESCRIPTION

Figure 1:
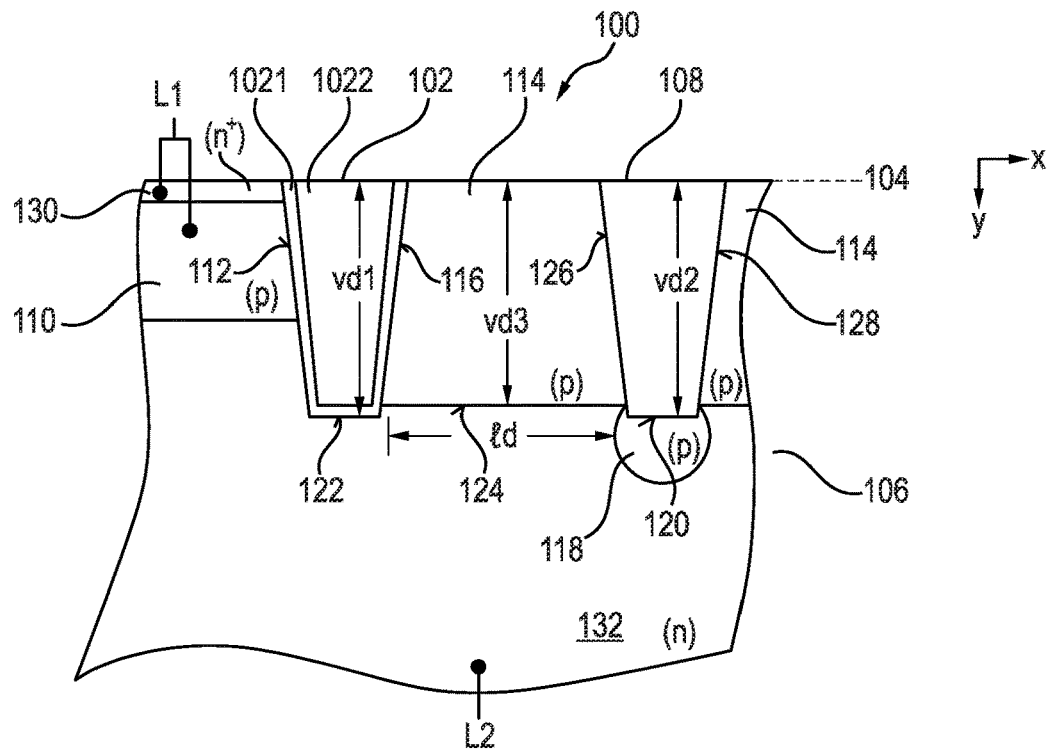
FIG. 1 is a schematic cross-sectional view for illustrating a SiC semiconductor device including a contact trench structure.

In the following detailed description, reference is made to the accompanying drawings, which form a part hereof and in which are shown by way of illustrations specific examples in which SiC semiconductor devices and methods of manufacturing a silicon carbide device may be practiced. It is to be understood that other examples may be utilized and structural or logical changes may be made without departing from the scope of the present disclosure. For example, features illustrated or described for one example can be used on or in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

Ranges given for physical dimensions include the boundary values. For example, a range for a parameter y from a to b reads as a≤y≤b. The same holds for ranges with one boundary value like "at most" and "at least".

Main constituents of a layer or a structure from a chemical compound or alloy are such elements which atoms form the chemical compound or alloy. For example, silicon (Si) and carbon (C) are the main constituents of a silicon carbide (SiC) layer.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include a trench gate structure extending from a first surface into a silicon carbide semiconductor body along a vertical direction.

The semiconductor device may further include a trench contact structure extending from the first surface into the silicon carbide semiconductor body along the vertical direction. The semiconductor device may further include a source region of a first conductivity type and a body region of a second conductivity type adjoining a first sidewall of the trench gate structure. The semiconductor device may further include a diode region of the second conductivity type adjoining a second sidewall of the trench gate structure opposite to the first sidewall. The semiconductor device may further include a shielding region of the second conductivity type adjoining a bottom of the trench contact structure. The shielding region may be arranged at a lateral distance to the trench gate structure.

The silicon carbide semiconductor body may be a crystalline semiconductor substrate. For example, the silicon carbide crystal may have a hexagonal polytype, e.g., 4H or 6H. The silicon carbide semiconductor body may be homogeneously doped or may include differently doped SiC layer portions. The silicon carbide semiconductor body may include one or more layers from another material with a melting point close to or higher than crystalline silicon carbide. For example, the layers from another material may be embedded in the crystalline silicon carbide substrate.

The silicon carbide semiconductor body may have two essentially parallel main surfaces of the same shape and size and a lateral surface area connecting the edges of the two main surfaces. For example, the silicon carbide semiconductor body may be a rectangular prism with or without rounded edges or a right cylinder or a slightly oblique cylinder (e.g. where the sides lean with an angle of at most 8° or at most 5° or at most 3°) with or without one or more flats or notches along the outer circumference.

The silicon carbide semiconductor body may laterally extend in a plane spanned by lateral directions (also called "horizontal directions").

Perpendicular to the lateral directions, in a vertical direction, the silicon carbide semiconductor body may have a thickness that is small compared to the respective extension of the silicon carbide semiconductor body in the lateral directions. The lateral directions may run parallel to the main surfaces or may enclose an angle of at most 10° or at most 8° or at most 5° with at least one of the main surfaces.

The trench gate structure may include a gate dielectric and a gate electrode. The gate dielectric may separate the gate electrode from the silicon carbide semiconductor body along at least one side of the trench gate structure. The gate dielectric may include or consist of thermally grown or deposited silicon oxide, silicon nitride, silicon oxynitride, another deposited dielectric material or any combination thereof. A thickness of the gate dielectric may be adjusted for setting a threshold voltage in a range from 1.0 V to 8 V, for example. In some embodiments, the trench gate structure may exclusively include the gate electrode and the gate dielectric. The gate electrode may include or consist of an electrode material or a combination of electrode materials, for example a doped semiconductor material (e.g., a degenerate doped semiconductor material) such as doped polycrystalline silicon, metal or metal compound, for example. The gate electrode may also include a combination of these materials, e.g. a liner material and a metal filling such as titanium nitride (TiN) and tungsten (W).

The trench contact structure may include a contact electrode. The contact electrode may directly adjoin the silicon carbide semiconductor body along at least one side of the trench contact structure. The trench contact structure may include or consist of a conductive material or a combination of conductive materials, for example a doped semiconductor material (e.g., a degenerate doped semiconductor material) such as doped polycrystalline silicon, metal or metal compound, for example. The contact structure may also include a combination of these materials, e.g. a liner material and a metal filling such as titanium nitride (TiN) and tungsten (W). Exemplary materials of electrodes, contacts or wiring layers include one or more of aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example.

For example, a gate trench of the trench gate structure and a contact trench of the trench contact structure may be concurrently formed. A lateral extent, e.g. a width, of the gate trench and a lateral extent, e.g. a width, of the contact trench may be equal. Likewise, a vertical extent, e.g. a depth, of the gate trench and a vertical extent, e.g. a depth, of the contact trench may be equal. In some embodiments, the vertical extent of the gate trench may differ from (e.g., may be smaller than) the vertical extent of the contact trench. A material or a combination of materials, e.g. a stack of materials, of the gate electrode may correspond to a material or a combination of materials, e.g. a stack of materials, of the contact electrode. For example, the trench gate structure may differ from the trench contact structure by the gate dielectric that is absent in the trench contact structure. Moreover, in a transistor cell area, a dielectric material, e.g. an interlayer dielectric such as an oxide and/or nitride plug, may cover the gate electrode at the first surface while the contact electrode may be electrically connected to a source electrode, for example.

The source region and the body region may be electrically connected to the source electrode at the first surface. The source electrode may constitute or be part of a wiring area formed over the silicon carbide semiconductor body. The wiring area may include one, two, three or even more wiring levels that may include patterned or non-patterned metal layers and interlayer dielectrics arranged between the patterned or non-patterned metal layers. Vias may electrically interconnect the different wiring levels, for example. The source region and the body region may be electrically connected to the source electrode at the first surface. For example, a highly doped body contact region may be arranged between the body region and the source electrode for improving an ohmic contact between the body region and the source electrode. For example, the source region and the body region may be electrically connected to the source electrode at source contact areas and body contact areas at the first surface, respectively. These contact areas may alternate along a longitudinal direction of the trench gate structure at the first surface. Alternatively or in addition, a groove contact extending into the silicon carbide semiconductor body may be electrically connected to the body region and/or to the body contact region at a bottom side, and optionally at the sidewalls, of the groove contact. The groove contact may also be electrically connected to the source region at the sidewalls of the groove contact. For example, the body region may directly adjoin the trench gate structure only at the first sidewall but not at the second sidewall. For example, the source region may directly adjoin the trench gate structure only at the first sidewall but not at the second sidewall.

The diode region may have a larger vertical extent, e.g. depth, than the body region, for example. A maximum doping concentration of the diode region may also be greater than a maximum doping concentration of the body region, for example. Formation of a conductive channel at the second sidewall of the trench gate structure may be suppressed by appropriately adjusting a threshold voltage, e.g. by a doping concentration of the diode region, and/or by omitting an electric connection of the channel at the first surface, e.g. by omitting a source region adjoining the second sidewall of the trench gate structure, for example. For example, the diode region may extend from the second sidewall of the trench gate structure to a first sidewall of the trench contact structure. The second sidewall of the trench gate structure may be opposite to the first sidewall of the trench contact structure, for example. In the examples described and illustrated herein, a plurality of trench gate structures and trench contact structures may form a regular stripe pattern. A length of the trench gate structures and the trench contact structures along a respective longitudinal direction of the trench gate structures and the trench contact structures may be up to several millimeters, for example. A vertical extension of the trench gate structures and the trench contact structures may be in a range from 0.3 μm to 5 μm, e.g., in a range from 0.5 μm to 2 μm. At the bottom, the trench gate structures and the trench contact structures may be rounded, for example. In other examples, some or all of the trench gate structures and the trench contact structures may be of a circular, a hexagonal or a square shape. A channel region and/or the body region may then adjoin more than one sidewall or even more than two sidewalls of the trench gate structure.

The shielding region may be self-aligned to the trench contact structure, for example. Self-alignment of the shielding region to the trench contact structure may be achieved by implanting dopants of the shielding region through a bottom of a contact trench, e.g. before forming the contact filling material in the contact trench. The shielding region may adjoin a predominant part, i.e. more than 50%, or all of a bottom side of the trench contact structure, for example. The shielding region may protect the gate dielectric of the trench gate structure from high electric field strengths occurring during a reverse voltage mode of the semiconductor device, for example. A maximum dopant concentration in the shielding region may be higher than a maximum dopant concentration in the body region, for example. A vertical dopant concentration profile in the shielding region may have a doping peak at a position below a bottom of the trench gate structure. In addition to the protection function of the shielding region, the shielding region may also provide the silicon carbide semiconductor device with an integrated fly-back diode functionality, for example.

The examples described herein may allow for a compact device structure including a self-adjusted shielding region, and for avoidance of expensive high-energy implants, especially such with high implantation doses, for example.

For example, a first vertical distance between a bottom of the trench gate structure and the first surface may be equal to a second vertical distance between the bottom of the trench contact structure and the first surface. This may allow for adjusting a vertical doping concentration profile of the shielding region starting at least from a bottom of the trench gate structure while utilizing sidewalls of the trench contact structure for electric contact purposes, e.g. ohmic or Schottky contacts. By introducing the ions at the bottom of the contact trench into the SiC semiconductor body, high-energy and/or high-dose implants may be avoided where the ions enter the SiC semiconductor body at the first surface of the SiC semiconductor body, for example.

For example, a combination of the trench contact structure and the shielding region may be symmetric with respect to the vertical direction (i.e., with respect to a symmetry axis that runs along the vertical direction). This may be achieved by forming the shielding region self-aligned to the contact trench, e.g. by ion implantation of dopants through a bottom of the contact trench, for example. When implanting the dopants through a bottom of the contact trench, the dopants enter the silicon carbide semiconductor body at the bottom of the contact trench. In view of limitations with respect to maximum ion implantation energies, this may allow for an increase of a depth range in which doping concentration profiles may be adjusted. A geometric shape or object is symmetric with respect to an axis or a direction if a (reflection/mirror) symmetry axis of the shape or object runs along or parallel to said axis or direction. For example, the shape or object is symmetric if it can be divided into two or more pieces that are identical (except for a reflection, i.e. a rotation by 180°). A cross-sectional view of the combination of the trench contact structure and the shielding region may be symmetric with respect to a vertical line extending through the center of the trench contact structure and the shielding region, thereby dividing the trench.

For example, the diode region and the shielding region may be merged. The attribute "merged" may mean that the diode region and the shielding region directly adjoin each other and/or overlap at least in places. When merging the diode region and the shielding region, the diode region may not only be directly connected to the contact trench structure, but may also be electrically coupled to the contact trench structure via the shielding region. Likewise, the shielding region may not only be directly connected to the contact trench structure, but may also be electrically coupled to the contact trench structure via the diode region. An overlap between the diode region and the shielding region may be adjusted by a tilt angle when implanting ions for forming the shielding region, for example.

For example, the shielding region may be arranged at a vertical distance to the diode region. A semiconductor region of a first conductivity type may be arranged between the shielding region and the diode region and may directly adjoin the trench contact structure. The semiconductor region of the first conductivity type may be a part of a drift region and/or a part of a current spread region, for example. The semiconductor region of the first conductivity and the trench contact structure may form a Schottky contact, for example. Thus, the contact trench may not only provide an electric contact, e.g. ohmic contact, to the shielding region and the diode region, but may also allow for compact integration of a Schottky diode into a transistor cell, for example.

For example, the body region may adjoin only the first sidewall of the trench gate structure out of the first and second sidewalls of the trench gate structure. The first sidewall may coincide with a crystal plane of the silicon carbide semiconductor body having a high charge carrier mobility, e.g. a {11-20} plane or so-called "a-plane".

For example, the first vertical distance between the bottom of the trench gate structure and the first surface may be equal to or greater than a third vertical distance between a bottom of the diode region and the first surface.

For example, the diode region may adjoin a first sidewall of the trench contact structure. Alternatively or in addition, the diode region may adjoin a second sidewall of the trench contact structure. It may be possible that a region between the trench contact structure and the trench gate structure is filled, e.g. by at least 80% or by at least 90% or even entirely, with a diode region.

For example, the semiconductor device may further include a current spread region of the first conductivity type. The semiconductor device may further include a drift region of the first conductivity type. The drift region may be arranged between the current spread region and a semiconductor substrate of the first conductivity type and/or between the current spread region and a contact region of the first conductivity type. A doping concentration of the current spread region may be larger than a doping concentration of the drift region. Exemplary values for a mean net dopant concentration in the drift region may be in the range from $10^{15}$ cm$^{-3}$ to $5 \times 10^{16}$ cm$^{-3}$. A mean net dopant concentration in the current spread region may be larger than the mean net dopant concentration in the drift region, e.g. by a factor range of 3 to 1000, or a factor range of 5 to 500, or a factor of 50 to 200, for example. Arrangement of the current spread region may allow for a further reduction of the area-specific on-state resistance RDS(on), for example. The current spread region may allow for improving an on-state resistance of the device by spreading a channel current between a channel end and the drift region, for example.

For example, the semiconductor device may include at least two trench contact structures. The trench gate structure may be arranged between a first one of the two trench contact structures and a second one of the two trench contact structures along a lateral direction. The source region and body region and/or diode region may also be arranged between the two trench contact structures, for example.

For example, a first lateral distance, e.g. at the first surface, between the trench gate structure and the first one of the two trench contact structures may be smaller than a second lateral distance between the trench gate structure and the second one of the two trench contact structures. For example, the source region and the body region may be arranged between trench gate structure and the second one of the trench contact structures, and the diode region may be arranged between the trench gate structure and the first one of the trench contact structures. The first distance and the second distance may be adjusted depending on target device parameters associated with functional requirements on the diode region and the source/body regions, respectively.

For example, the body region may be arranged at a lateral distance to the second one of the two trench contact structures. This may allow for electrically connecting the diode region at part of the first surface that is arranged between the source region and the second one of the two trench contact structures, for example.

For example, the source region may directly adjoin the second one of the two trench contact structures. This may allow for minimizing lateral transistor cell dimensions, e.g. a transistor cell pitch, for example.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Exemplary details on structural elements, e.g. materials, dimensions, functions or relations to other structural elements, described in the examples above likewise apply to the examples of methods and devices described further below and vice versa.

An example of a method of manufacturing a semiconductor device may include forming a trench gate structure extending from a first surface into a silicon carbide semiconductor body along a vertical direction. The method may further include forming a trench contact structure extending from the first surface into the silicon carbide semiconductor body. The method may further include forming a source region of a first conductivity type and a body region of a second conductivity type, both adjoining a first sidewall of the trench gate structure. The method may further include forming a diode region of the second conductivity type adjoining a second sidewall of the trench gate structure opposite to the body region. The method may further include forming a shielding region of the second conductivity type adjoining a bottom of the trench contact structure, wherein the shielding region may be arranged at a lateral distance to the trench gate structure.

For example, forming the trench gate structure may include forming a gate trench extending from the first surface into the silicon carbide semiconductor body along the vertical direction. For example, forming the trench contact structure may include forming a contact trench extending from the first surface into the silicon carbide semiconductor body along the vertical direction. The gate trench and the contact trench may be formed concurrently. This may allow for a cost-effective formation of structural elements with different function by a common photolithographic mask process, for example.

For example, the shielding region may be formed self-aligned to the trench contact structure by at least one ion implantation of dopants through a bottom of the contact trench.

For example, forming the trench gate structure may include forming a gate dielectric in the gate trench and forming a gate electrode in the gate trench. Forming the trench contact structure may include forming a conducting material in the contact trench. The gate electrode in the gate trench and the conducting material in the contact trench may be concurrently formed.

The examples described above may be examples of a power semiconductor device or examples for manufacturing a power semiconductor device, e.g. a silicon carbide power semiconductor device. The power semiconductor device or an electrical structure (e.g. transistor of the silicon carbide device) of the power semiconductor device may have a breakdown voltage or blocking voltage of more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The examples and features described above and below may be combined.

More details and aspects are mentioned in connection with the examples described above or below. Processing the wide band gap semiconductor wafer may comprise one or more optional additional features corresponding to one or more aspects mentioned in connection with the proposed concept or one or more examples described above or below.

The aspects and features mentioned and described together with one or more of the previously described examples and figures, may as well be combined with one or more of the other examples in order to replace a like feature of the other example or in order to additionally introduce the feature to the other example.

The methods may be applied for manufacturing the semiconductor device as described with respect to any of the above examples or any of the examples described below in connection with the figures. In at least some examples of the method, the following features (if applicable) apply, alone or in combination:
(i) forming at least one of the source region, the body region, the current spread region, the diode region and the shielding region may include at least one masked or unmasked ion implantation process;
(ii) forming the diode region may include two or more ion implantation processes having different ion implantation energies/ion implantation doses;
(iii) forming the shielding region may include at least one tilted ion implantation process for adjusting an overlap to the diode region.

It will be appreciated that while the method is described above and below as a series of steps or events, the described ordering of such steps or events are not to be interpreted in a limiting sense. Rather, some steps may occur in different orders and/or concurrently with other steps or events apart from those described above and below.

Functional and structural details described with respect to the examples above shall likewise apply to the exemplary examples illustrated in the figures and described further below.

Referring to the schematic cross-sectional view of FIG. 1, an example of a semiconductor device 100 is illustrated.

The semiconductor device 100 includes a trench gate structure 102 extending from a first surface 104 into a silicon carbide semiconductor body 106 along a vertical direction y. The trench gate structure 102 includes a gate dielectric 1021 and a gate electrode 1022.

A trench contact structure 108 extends from the first surface 104 into the silicon carbide semiconductor body 106 along the vertical direction y.

An $n^+$-doped source region 130 and a p-doped body region 110 adjoin a first sidewall 112 of the trench gate structure 102. The $n^+$-doped source region 130 and the p-doped body region 110 are electrically connected to a first load electrode L1, e.g. a source electrode. The first load electrode L1 may be formed in a wiring area above the first surface, for example (not illustrated in FIG. 1). A conductivity of a channel close to an interface between the body region 110 and the gate dielectric 1021 may be controlled by a voltage applied to the gate electrode 1022, for example.

A p-doped diode region 114 adjoins a second sidewall 116 of the trench gate structure 102 opposite to the first sidewall 112. The p-doped diode region 114 may be electrically connected at the first surface 104, e.g. to the source electrode, and at the contact trench structure 108.

A p-doped shielding region 118 adjoins a bottom 120 of the trench contact structure 108. The p-doped shielding region 118 may be self-aligned to the trench contact structure 108. The shielding region 118 is arranged at a lateral distance 1d to the trench gate structure 102.

In the example illustrated in FIG. 1, a first vertical distance vd1 between a bottom 122 of the trench gate structure 102 and the first surface 104 is equal to a second vertical distance vd2 between a bottom 120 of the trench contact structure 108 and the first surface 104. An n-doped drift structure 132 adjoins a bottom side of the body region 110 and is electrically connected to a second load electrode L2, e.g. a drain electrode, at a second surface opposite to the first surface 104.

Figure 2:
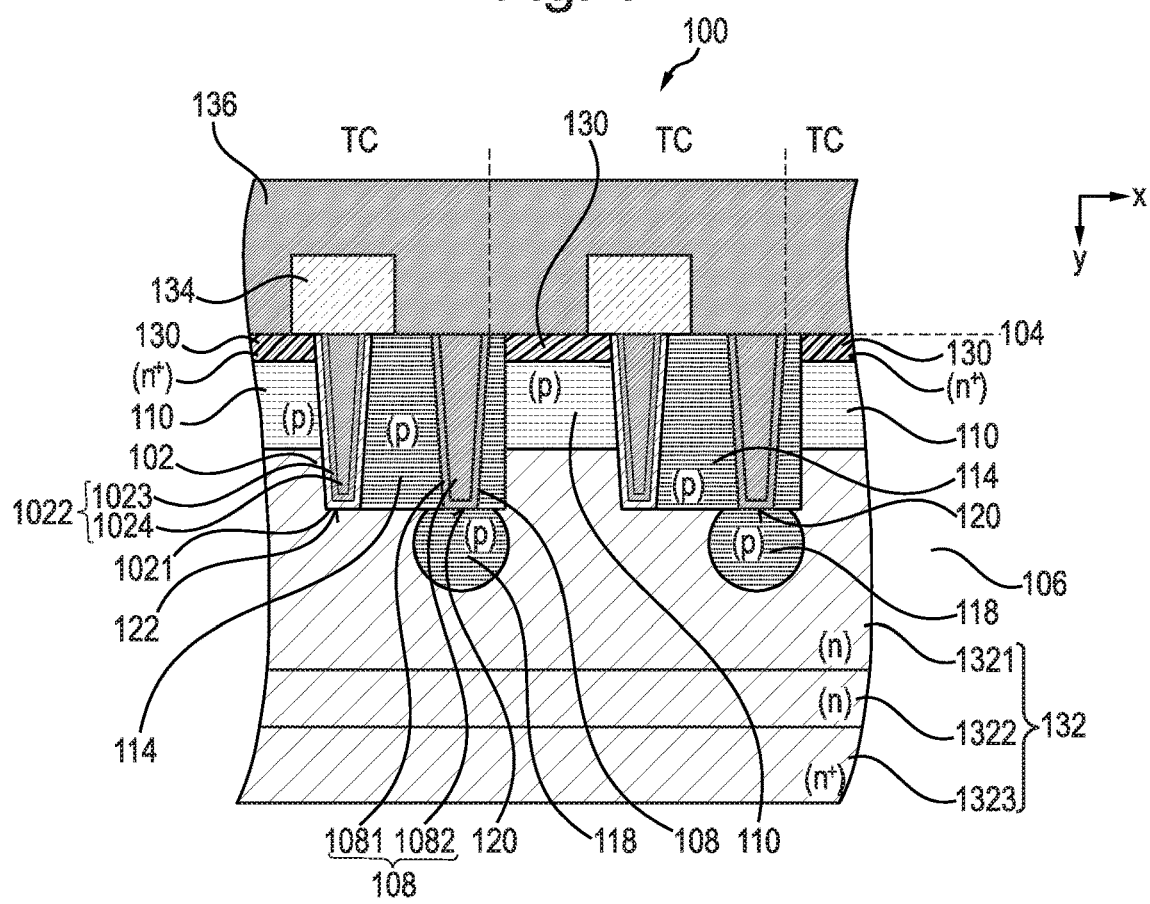
FIGS. 2 to 4 are schematic cross-sectional views for illustrating examples of SiC semiconductor devices that are based on the example of FIG. 1.

Referring to the schematic cross-sectional view of FIG. 2, another example of a semiconductor device 100 is illustrated. The example is based on the example of FIG. 1, but illustrated in more detail.

The semiconductor device includes a plurality of transistor cells TC electrically connected in parallel.

The trench gate structure 102 of each transistor cell TC includes the gate dielectric 1021 and the gate electrode 1022. The gate electrode 1022 includes a gate electrode liner 1023 and a gate electrode filling material 1024. The trench contact structure 108 of each transistor cell TC includes a contact liner 1081 and a contact filling material 1082. The contact liner 1081 and the gate electrode liner 1023 may be formed concurrently, for example. The contact filling material 1082 and the gate electrode filling material 1024 may be formed concurrently, for example. A dielectric plug 134 is arranged on the trench gate structure 102 and electrically insulates the gate electrode 1022 from a source electrode 136 over the first surface 104. The source electrode 136 is electrically connected to the trench contact structure 108, to the diode region 114, to the source region 130, and to the body region 110 at the first surface 104. An n-doped drift structure 132 includes an n-doped drift region 1321, an n-doped buffer region 1322 and an $n^+$-doped substrate region 1323. In some other examples, the drift structure may further include a current spread region arranged between the drift region 1321 and the body region 110. The substrate region 1323 may also be omitted from the drift structure 132.

In the example illustrated in FIG. 2, the shielding region 118 and the diode region 114 are merged. The body region 110 is arranged at a lateral distance to trench contact structure 108 of a neighboring transistor TC. The source region 130 is also arranged at a lateral distance to the trench contact structure 108 of a neighboring transistor TC. The body region 110 may be electrically connected to the source electrode 136 via the diode region 114 of a neighboring transistor cell TC, for example.

Figure 3:
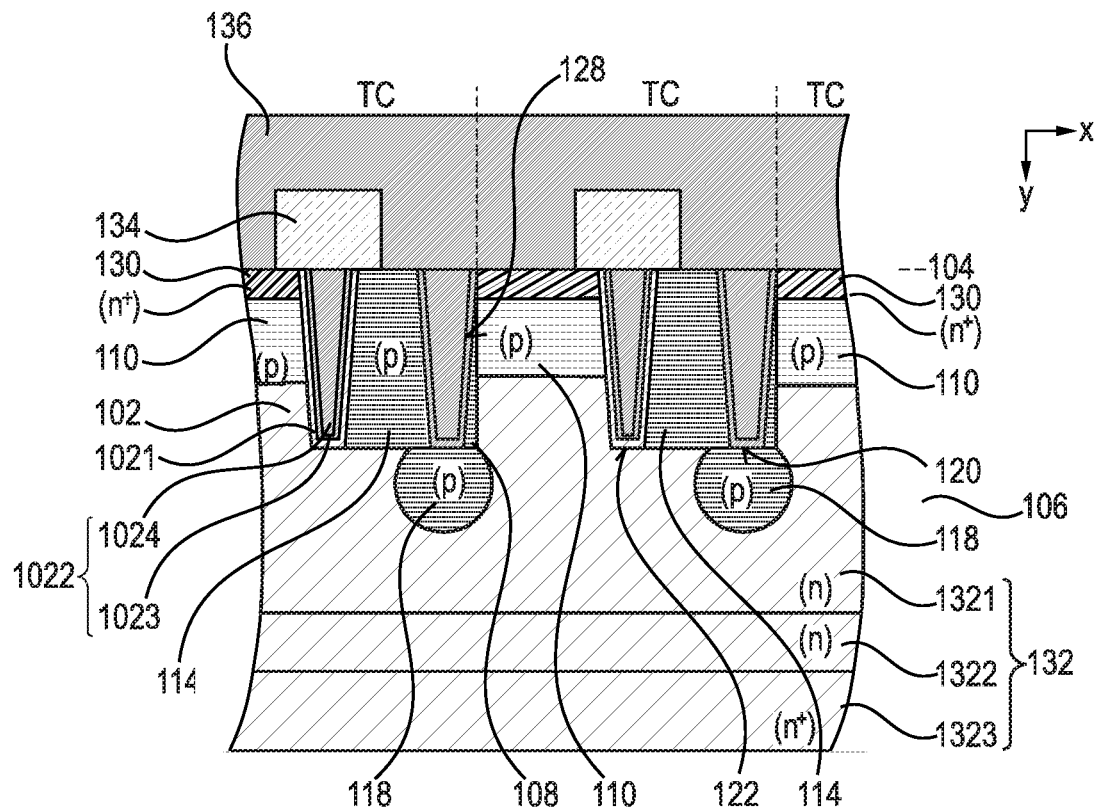

Referring to the schematic cross-sectional view of FIG. 3, another example of a semiconductor device 100 is illustrated. The example is based on the example of FIG. 1, but illustrated in more detail. The example illustrated in FIG. 3 differs from the example illustrated in FIG. 2 in that the source region 130 adjoins the second sidewall 128 of the contact trench structure 108 of a neighboring transistor cell TC. The body region 110 may be electrically connected to the source electrode 136 via the first surface 104 (not illustrated in FIG. 3) and/or via the diode region 114 and the contact trench structure 108 of the neighboring transistor cell TC, for example.

Figure 4:
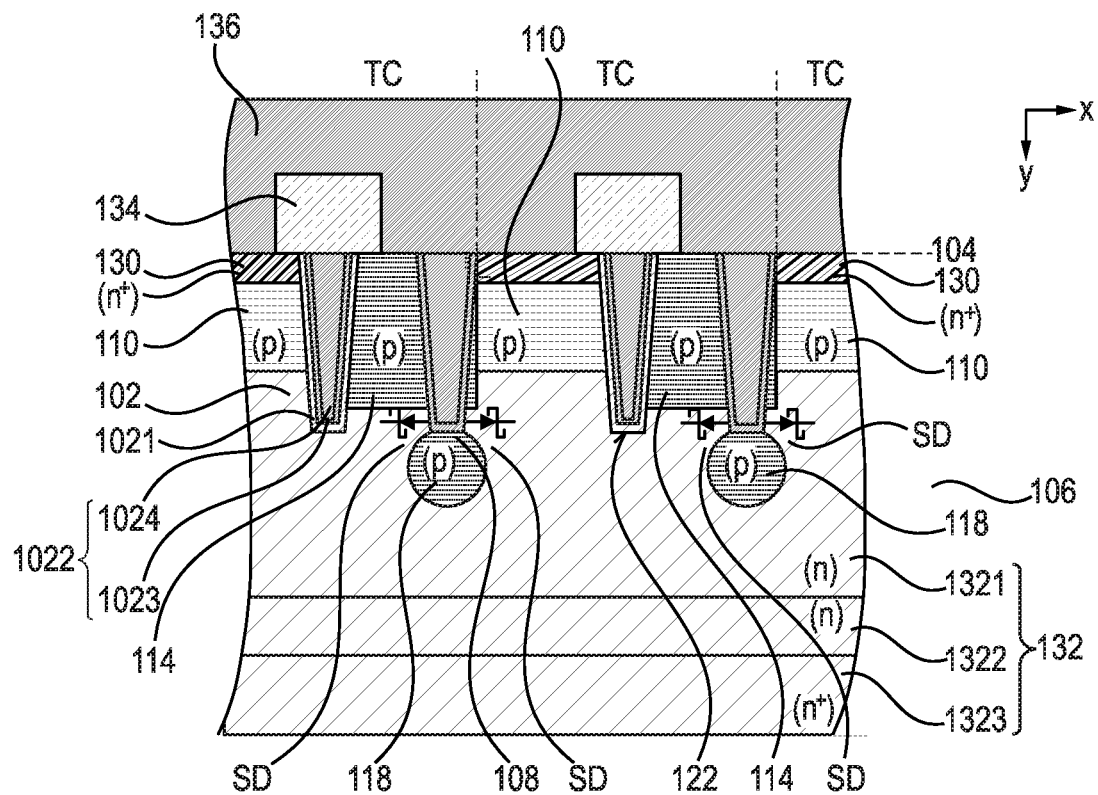

Referring to the schematic cross-sectional view of FIG. 4, another example of a semiconductor device 100 is illustrated. The example is based on the example of FIG. 1, but illustrated in more detail. The example illustrated in FIG. 4 differs from the example illustrated in FIG. 3 in that the shielding region 118 is arranged at a vertical distance to the diode region 114. A part of the drift region 1321 is arranged between the shielding region 118 and the diode region 114 and directly adjoins the trench contact structure 108 for forming a compact integration of a Schottky diode SD into the transistor cells TC, for example.

An example of a method of manufacturing a semiconductor device, e.g. the semiconductor device illustrated in FIG. 1, is illustrated and described with reference to the schematic cross-sectional views of FIGS. 5A to 5K.

Figure 5A:
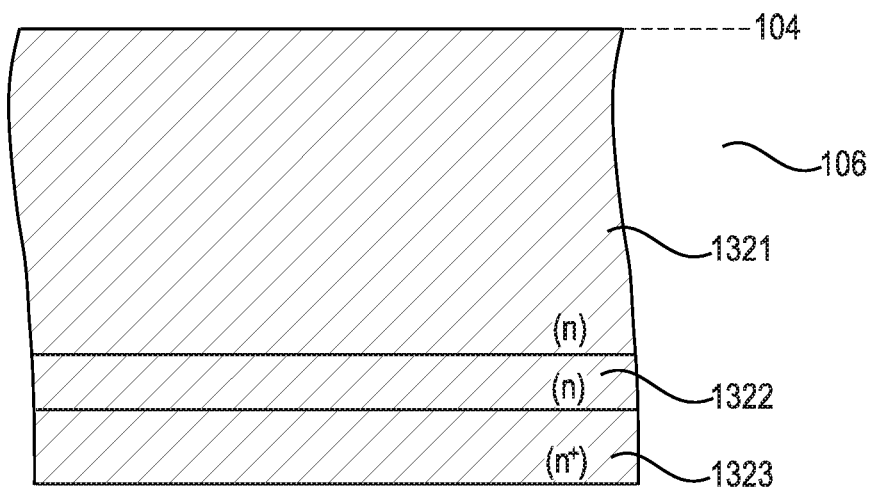
FIGS. 5A to 5K are schematic cross-sectional views for illustrating a method of manufacturing SiC semiconductor device including a contact trench structure.

Referring to FIG. 5A, the buffer region 1322 and the drift region 1321 are formed on the substrate region 1323, e.g. by at least one layer deposition process. By way of example, chemical vapor deposition (CVD) may be used for epitaxial growth of the buffer region 1322 and the drift region 1321 on the substrate region 1323.

Figure 5B:
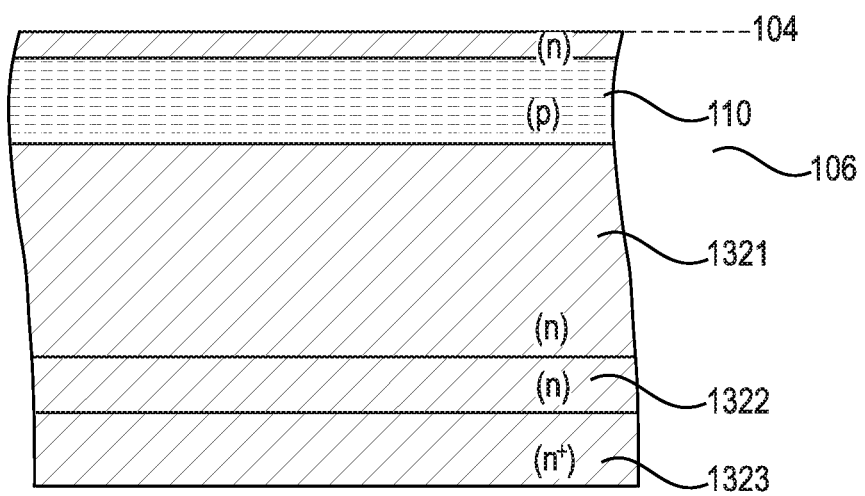

Referring to FIG. 5B, the body region 110 may be formed in the drift region 1321, e.g. by at least one masked and/or unmasked ion implantation process. Optionally, further regions, e.g. the current spread region, may be formed by at least one further ion implantation process, for example.

Figure 5C:
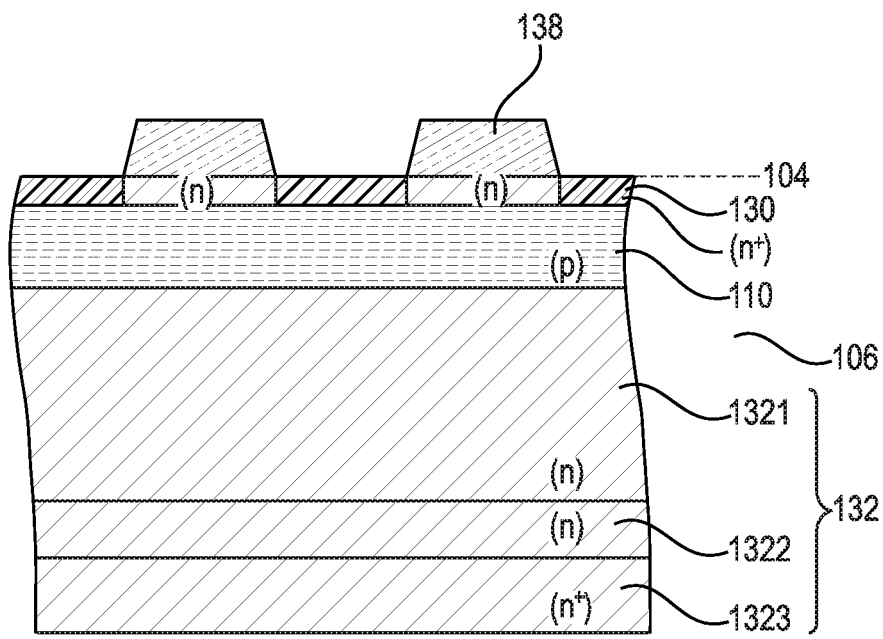

Referring to FIG. 5C, the source region 130 is formed by a at least one ion implantation process using a first mask 138.

Figure 5D:
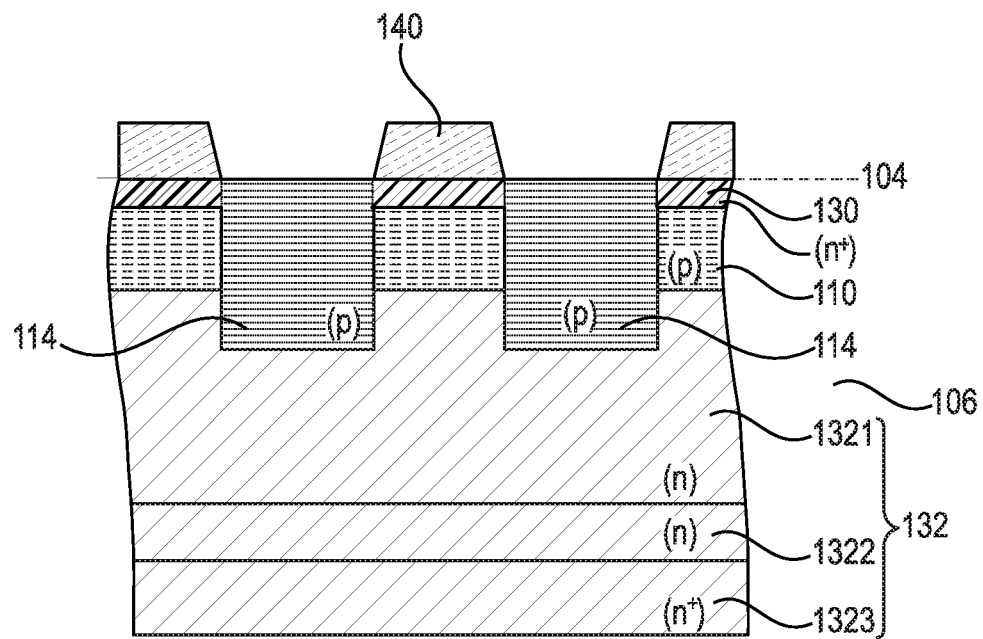

Referring to FIG. 5D, the diode region 108 is formed by a at least one ion implantation process using a second mask 140.

Figure 5E:
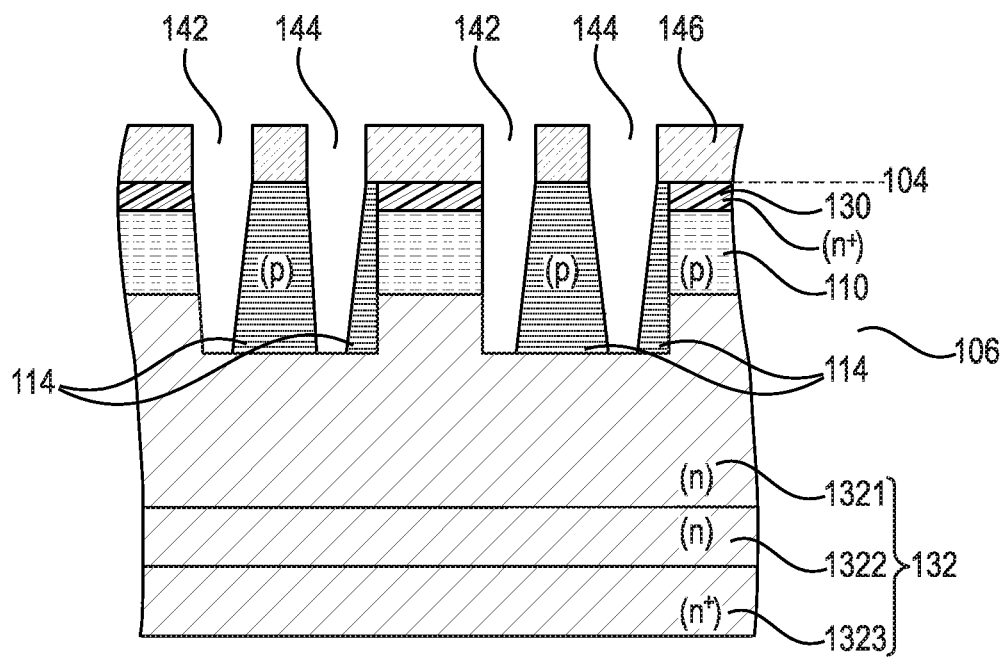

Referring to FIG. 5E, gate trenches 142 and contact trenches 144 are formed at the first surface 104, e.g. by at least one etch process using a third mask 146, e.g. a hard mask.

Figure 5F:
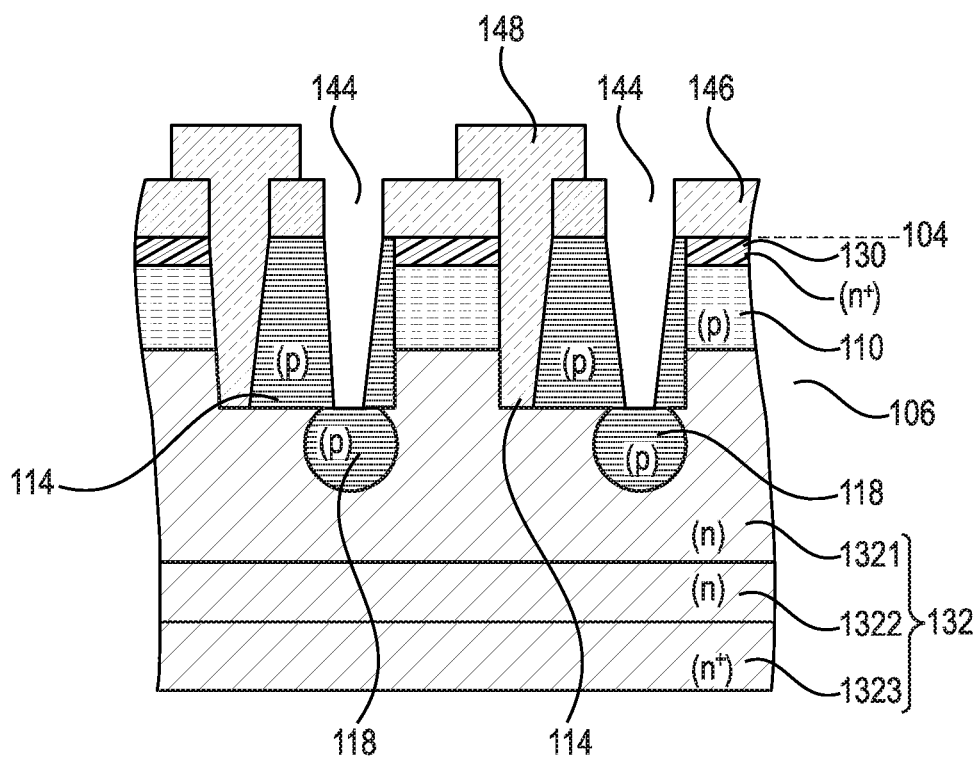

Referring to FIG. 5F, the shielding region 118 is formed by at least one ion implantation process through a bottom of the contact trenches 144 using a fourth mask 148 filling and covering the gate trenches 142. Tilted ion implantation may allow for setting an overlap between the shielding region 118 and the diode region 114, for example.

Figure 5G:
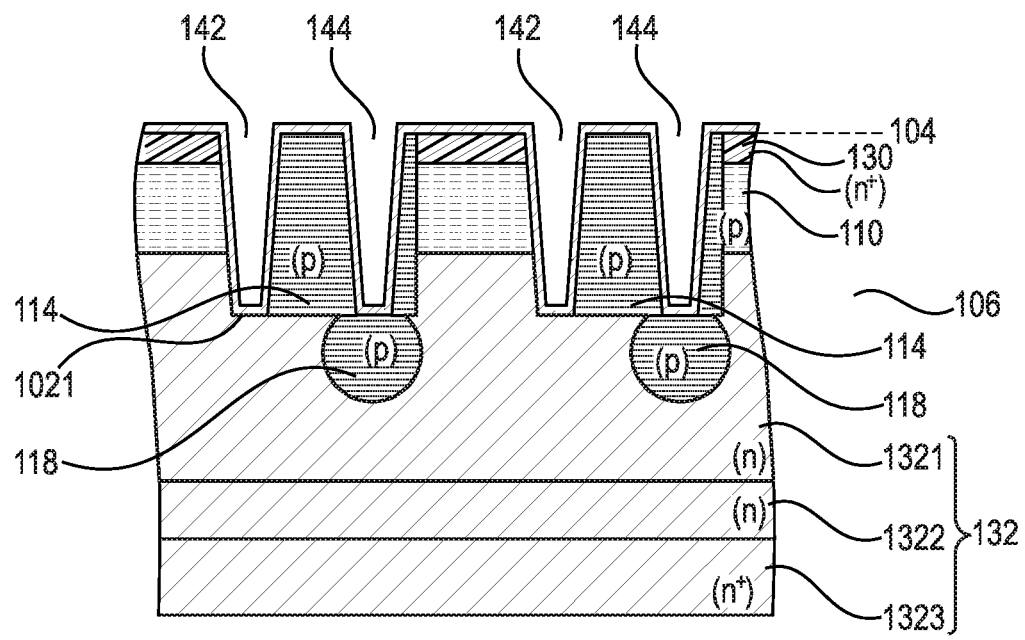

Referring to FIG. 5G, the fourth mask 148 is removed and the gate dielectric 1021 is formed in the gate trenches 142 and in the contact trenches 144.

Figure 5H:
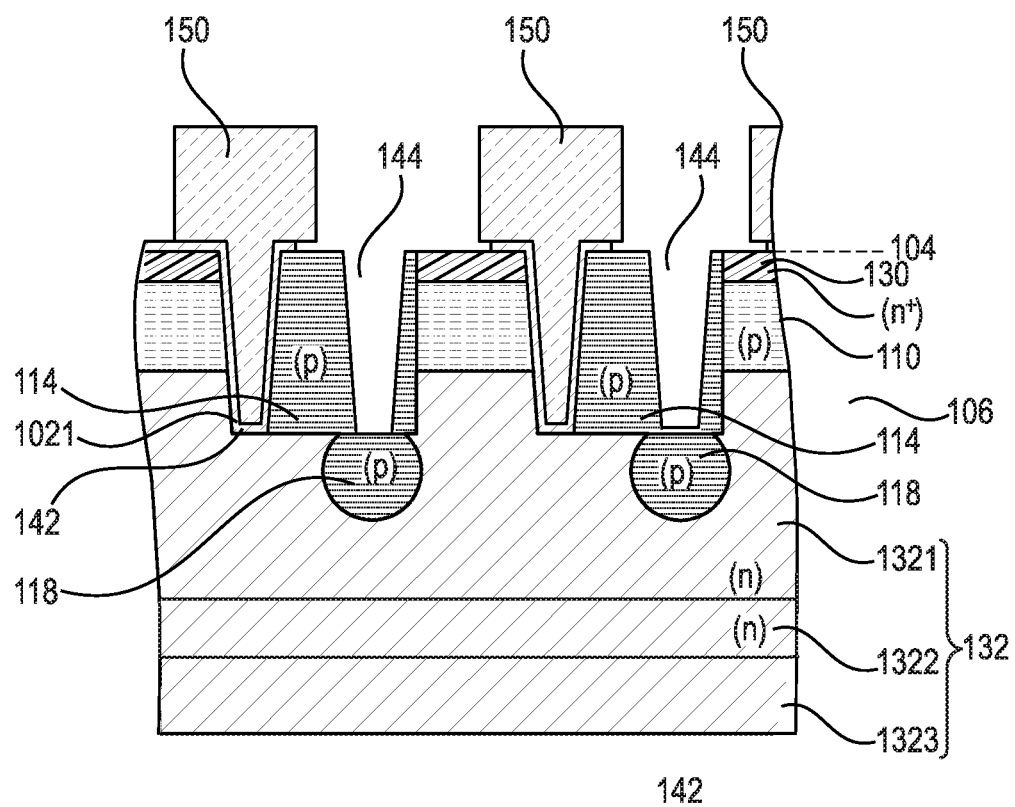

Referring to FIG. 5H, the gate dielectric 1021 is removed from the contact trenches 144 using a fifth mask 150 covering the gate dielectric 1021 in the gate trenches 142.

Figure 5I:
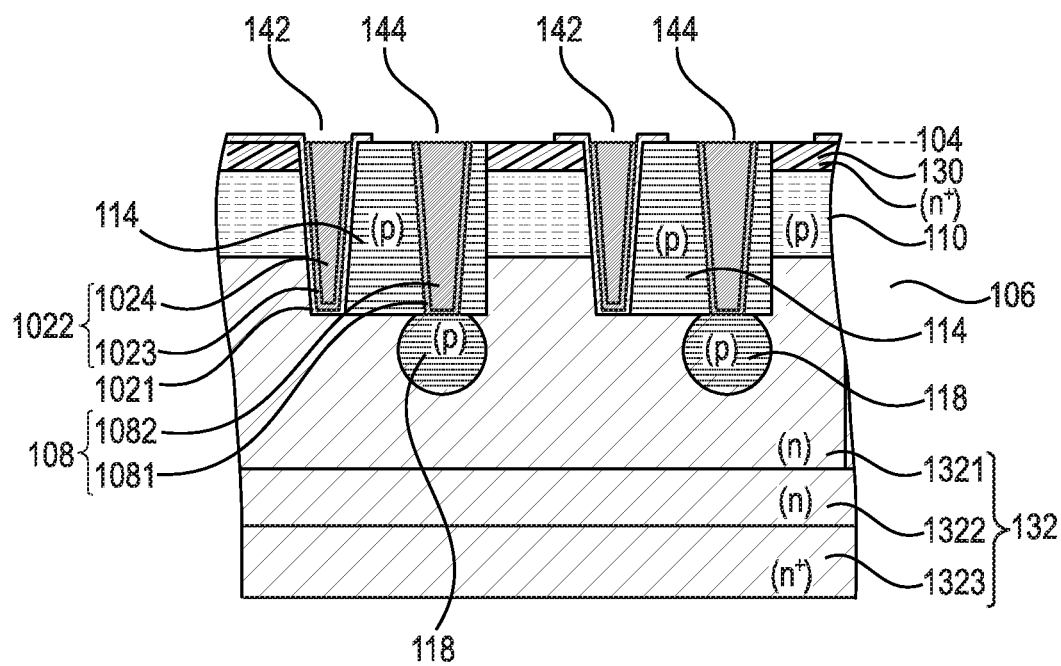

Referring to FIG. 5I, the fifth mask 150 is removed. The gate electrode liner 1023 and the contact liner 1081 are formed concurrently in the gate trenches 142 and in the contact trenches 144, respectively. The gate electrode filling material 1024 and the contact filling material 1082 are formed concurrently in the gate trenches 142 and in the contact trenches 144, respectively.

Figure 5J:
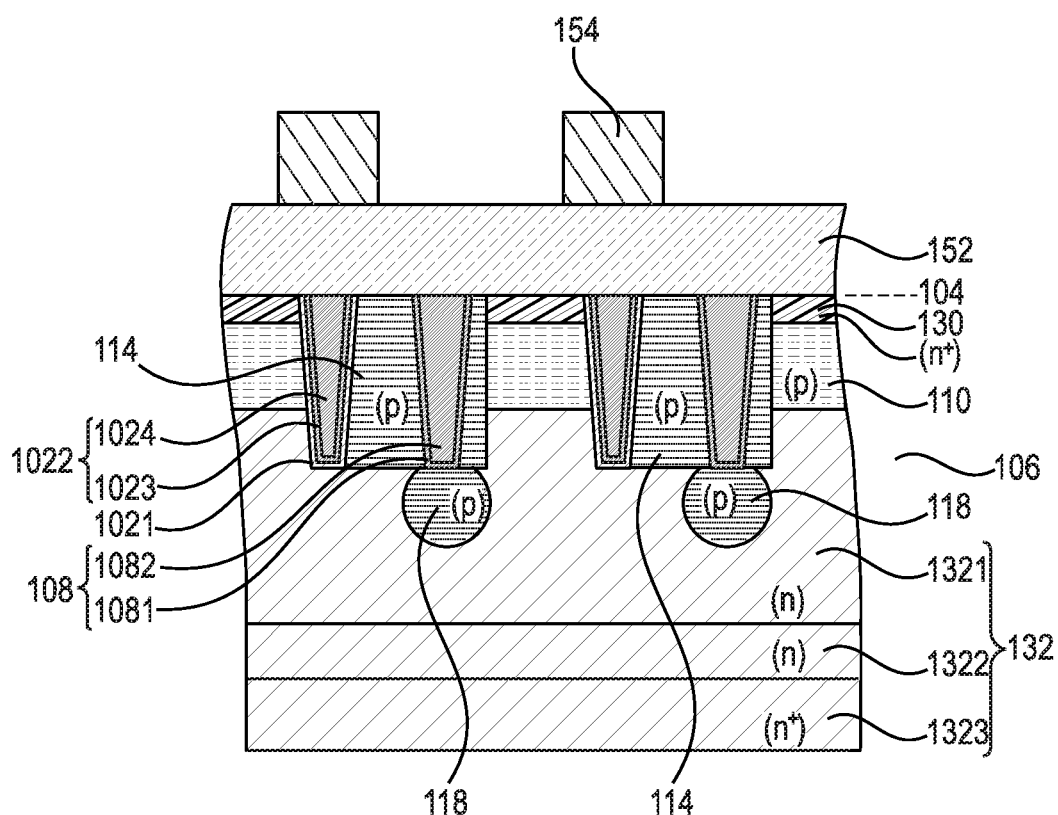

Referring to FIG. 5J, an interlayer dielectric 152 is formed over the gate trenches 142 and the contact trenches 144. A sixth mask 154 for patterning the interlayer dielectric 152 is formed on the interlayer dielectric 152.

Figure 5K:
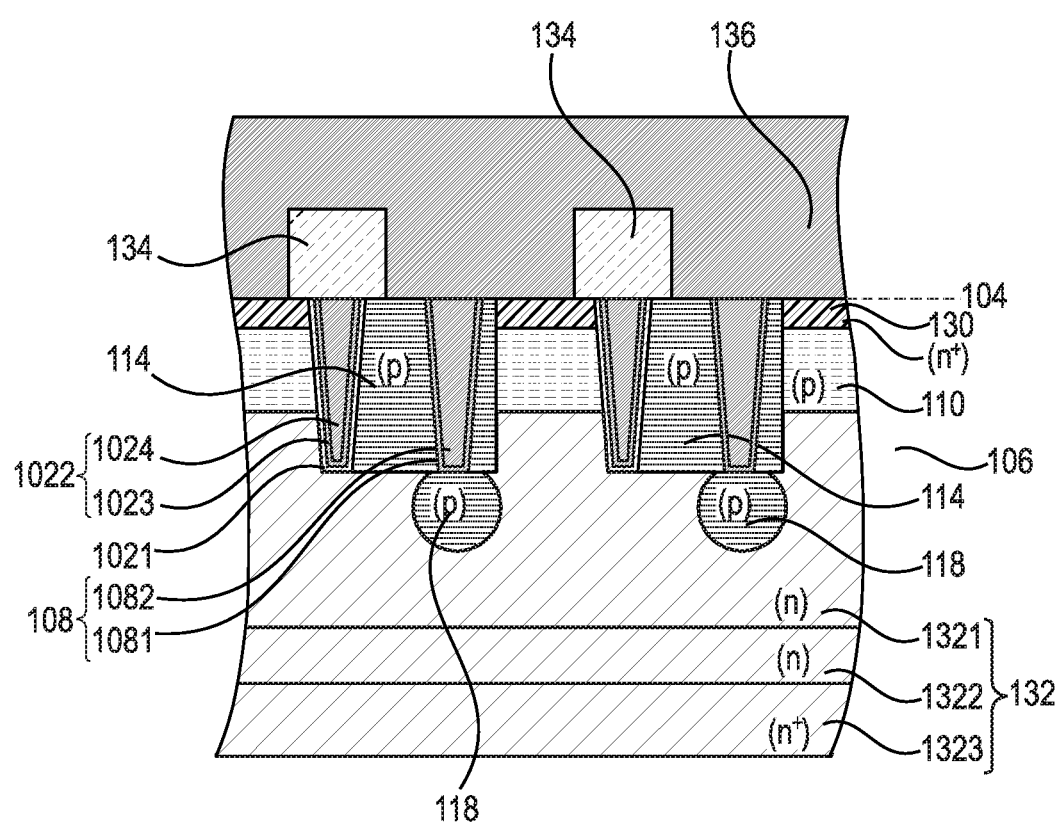

Referring to FIG. 5K, the interlayer dielectric 152 is patterned via the sixth mask 154. This results in the dielectric plugs 134. The source electrode 136 is formed over the first surface 104 of the semiconductor body 106.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

Although specific embodiments have been illustrated and de-scribed herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench gate structure extending from a first surface into a silicon carbide semiconductor body along a vertical direction;
   a trench contact structure extending from the first surface into the silicon carbide semiconductor body along the vertical direction, wherein the trench contact structure is arranged at a lateral distance to the trench gate structure at the first surface;
   a source region of a first conductivity type and a body region of a second conductivity type adjoining a first sidewall of the trench gate structure;
   a diode region of the second conductivity type adjoining a second sidewall of the trench gate structure opposite to the first sidewall; and
   a shielding region of the second conductivity type adjoining a bottom of the trench contact structure, wherein the shielding region is arranged at a lateral distance to the trench gate structure.

2. The semiconductor device of claim 1, wherein a first vertical distance between a bottom of the trench gate structure and the first surface is equal to a second vertical distance between the bottom of the trench contact structure and the first surface.

3. The semiconductor device of claim 1, wherein a combination of the trench contact structure and the shielding region is symmetric with respect to the vertical direction.

4. The semiconductor device of claim 1, wherein the diode region and the shielding region are merged.

5. The semiconductor device of claim 1, wherein the shielding region is arranged at a vertical distance to the diode region, and wherein a semiconductor region of a first conductivity type is arranged between the shielding region and the diode region and directly adjoins the trench contact structure.

6. The semiconductor device of claim 1, wherein the body region adjoins the first sidewall but not the second sidewall of the trench gate structure.

7. The semiconductor device of claim 1, wherein the first vertical distance between the bottom of the trench gate structure and the first surface is equal to or greater than a third vertical distance between a bottom of the diode region and the first surface.

8. The semiconductor device of claim 1, wherein the diode region adjoins a first sidewall of the trench contact structure and a second sidewall of the trench contact structure.

9. The semiconductor device of claim 1, further comprising:
   a current spread region of the first conductivity type; and
   a drift region of the first conductivity type,
   wherein the drift region is arranged between the current spread region and a semiconductor substrate of the first conductivity type and/or between the current spread region and a contact region of the first conductivity type,
   wherein a doping concentration of the current spread region is larger than a doping concentration of the drift region.

10. The semiconductor device of claim 1, wherein the semiconductor device comprises at least two trench contact structures, wherein the trench gate structure is arranged between a first one of the at least two trench contact structures and a second one of the at least two trench contact structures along a lateral direction.

11. The semiconductor device of claim 10, wherein a first lateral distance between the trench gate structure and the first one of the at least two trench contact structures is smaller than a second lateral distance between the trench gate structure and the second one of the at least two trench contact structures.

12. The semiconductor device of claim 10, wherein the body region is arranged at a lateral distance to the second one of the at least two trench contact structures.

13. The semiconductor device of claim 10, wherein the source region directly adjoins the second one of the at least two trench contact structures.

14. A method of manufacturing a semiconductor device, the method comprising:
   forming a trench gate structure extending from a first surface into a silicon carbide semiconductor body along a vertical direction;
   forming a trench contact structure extending from the first surface into the silicon carbide semiconductor body, wherein the trench contact structure is arranged at a lateral distance to the trench gate structure at the first surface;
   forming a source region of a first conductivity type and a body region of a second conductivity type, both adjoining a first sidewall of the trench gate structure;
   forming a diode region of the second conductivity type adjoining a second sidewall of the trench gate structure opposite to the first sidewall; and
   forming a shielding region of the second conductivity type adjoining a bottom of the trench contact structure, wherein the shielding region is arranged at a lateral distance to the trench gate structure.

15. The method of claim 14, wherein:
   forming the trench gate structure comprises forming a gate trench extending from the first surface into the silicon carbide semiconductor body along the vertical direction;
   forming the trench contact structure comprises forming a contact trench extending from the first surface into the silicon carbide semiconductor body along the vertical direction; and
   the gate trench and the contact trench are formed concurrently.

16. The method of claim 15, wherein the shielding region is formed self-aligned to the trench contact structure by at least one ion implantation of dopants through a bottom of the contact trench.

17. The method of claim 15, wherein:
   forming the trench gate structure further comprises forming a gate dielectric in the gate trench and forming a gate electrode in the gate trench;
   forming the trench contact structure further comprises forming a conducting material in the contact trench; and
   the gate electrode in the gate trench and the conducting material in the contact trench are concurrently formed.

* * * * *